(12) United States Patent
Moser et al.

(10) Patent No.: US 8,200,178 B2
(45) Date of Patent: Jun. 12, 2012

(54) METHOD FOR OBTAINING FIELD STRENGTH INFORMATION

(75) Inventors: Daniel Moser, Korntal-Muenchingen (DE); Thomas Saile, Forchtenberg (DE)

(73) Assignee: Atmel Corporation, San Jose, CA (US)

( * ) Notice: Subject to any disclaimer, the term of this patent is extended or adjusted under 35 U.S.C. 154(b) by 226 days.

(21) Appl. No.: 12/778,550

(22) Filed: May 12, 2010

(65) Prior Publication Data
US 2010/0291892 A1 Nov. 18, 2010

Related U.S. Application Data

(60) Provisional application No. 61/177,805, filed on May 13, 2009.

(30) Foreign Application Priority Data

May 13, 2009 (DE) .......................... 10 2009 021 153

(51) Int. Cl.
*H04B 17/00* (2006.01)

(52) U.S. Cl. .................................. 455/226.1; 455/67.11

(58) Field of Classification Search .... 455/226.1–226.4, 455/67.11–67.16, 115.1–115.4, 127.1–127.5, 455/232.1–253.2; 330/279, 96, 102, 127, 330/134, 135
See application file for complete search history.

(56) References Cited

U.S. PATENT DOCUMENTS

| | | | |
|---|---|---|---|
| 4,325,024 A | 4/1982 | Heidenreich et al. | |
| 4,382,227 A | 5/1983 | Olivenbaum et al. | |
| 5,475,342 A * | 12/1995 | Nakamura et al. | 330/136 |
| 6,922,553 B2 | 7/2005 | Blatz et al. | |
| 7,075,464 B2 | 7/2006 | Hehn | |
| 7,076,009 B2 * | 7/2006 | Wieck | 455/226.2 |
| 7,139,540 B2 * | 11/2006 | Wu et al. | 455/226.1 |
| 7,233,242 B2 * | 6/2007 | Elliott et al. | 455/67.11 |
| 7,346,318 B2 * | 3/2008 | Tsutsui et al. | 455/127.4 |
| 7,353,124 B2 | 4/2008 | Luo | |
| 7,525,376 B2 * | 4/2009 | Boughton, Jr. | 330/102 |
| 7,848,724 B2 * | 12/2010 | Bult et al. | 455/232.1 |
| 7,860,454 B2 * | 12/2010 | Moloudi et al. | 455/253.2 |
| 2003/0104795 A1 | 6/2003 | Blatz et al. | |

FOREIGN PATENT DOCUMENTS

| | | |
|---|---|---|
| DE | 19 06 756 A1 | 11/1969 |
| DE | 29 28 517 A1 | 1/1981 |
| DE | 10 2004 036 352 B4 | 10/2007 |
| EP | 1 318 623 A2 | 6/2003 |
| EP | 1 318 623 A2 | 11/2003 |

* cited by examiner

*Primary Examiner* — Lana N Le
(74) *Attorney, Agent, or Firm* — Baker Botts L.L.P.

(57) ABSTRACT

A method for obtaining field strength information from a received electromagnetic signal by a receiver unit is provided, whereby an input voltage for an operational amplifier is generated from the received signal in the receiver unit by means of an input resistance realized as a voltage divider circuit and an output voltage is generated by the operational amplifier by means of a fixed amplification factor. The input voltage is changed until the output voltage lies within a predefined interval that includes the value of the reference voltage. The input voltage is tapped at the voltage divider circuit and, to change the input voltage at the voltage divider circuit, which has a plurality of divider nodes and a constant resistance value, a divider node is selected and a partial voltage is tapped. The field strength value received by the receiver unit is determined from a comparison of a quantity assigned to the selected divider node.

13 Claims, 3 Drawing Sheets

METHOD FOR OBTAINING FIELD STRENGTH INFORMATION

This nonprovisional application claims priority to German Patent Application No. DE 10 2009 021 153.5, which was filed in Germany on May 13, 2009, and to U.S. Provisional Application No. 61/177,805, which was filed on May 13 2009, and which are both herein incorporated by reference.

BACKGROUND OF THE INVENTION

1. Field of the Invention

The present invention relates to a method for obtaining field strength information and to a circuit arrangement.

2. Description of the Background Art

A method of this type is known from European Pat. No. EP 1 318 623 B1, which corresponds to U.S. Pat. No. 6,922,553, and which is incorporated herein by reference. Inter alia, a distance between the transmitter and receiver can be determined by means of the field strength information and can be used as a means for detecting relaying. In general, a so-called "RSSI (Received Signal Strength Indicator)" value, which is related to the input signal of a receiving antenna, is determined from the received signal strength. In this regard, an input voltage for an operational amplifier is generated from a received electromagnetic signal via a receiver unit with an input resistance, and an output voltage is provided by the operational amplifier by means of a fixed amplification factor.

The input voltage at the operational amplifier is changed until the output voltage lies within a predefined interval that includes the value of the reference voltage. To this end, the input voltage at the divider node of a voltage divider is tapped and, to adjust the output voltage to the reference voltage, the resistance of the voltage divider is changed by means of connection or disconnection of resistance branches connected to one another in a complex parallel circuit.

Furthermore, the method is used to determine the distance of the receiver unit from a transmitting unit from the determined field strength values. Because of the fixedly predefined values of the resistance branches of the parallel circuit, the spatial resolution is very different depending on the distance; the spatial resolution is insufficient particularly at a small distance. Furthermore, the total resistance changes depending on the selected parallel resistance. The load of an antenna circuit connected upstream changes as a result. Because of the change in load, the impedance of the antenna circuit changes in turn and in the case of an inductive coupling, feedback to the transmission circuit of a transmitter occurs in addition.

Inter alia, methods for obtaining field strength information are used in systems for contactless data transmission. An important field of application is identification systems, which are used, for example, in a motor vehicle, for access control. Such identification systems include a base unit and one or more transponders; such methods are also used for determining the field strength values or the distance preferably in the transponders, which are constructed, for example, as passive and must draw the energy needed for operation by absorption from the electromagnetic field of the base station.

SUMMARY OF THE INVENTION

It is therefore an object of the present invention to provide a method via which a field strength of an input signal can be determined. A further object of the present invention is to provide a circuit arrangement for carrying out the method.

According to a first embodiment of the present invention, a method is provided for obtaining field strength information from a received electromagnetic signal by a receiver unit, whereby an input voltage for an operational amplifier is generated from the received signal in the receiver unit by an input resistance realized as a voltage divider circuit and an output voltage is generated by the operational amplifier by a fixed amplification factor. The input voltage is changed until the output voltage lies within a predefined interval that includes the value of the reference voltage. To this end, the input voltage is tapped at the voltage divider circuit and to change the input voltage at the voltage divider circuit, which has a plurality of divider nodes and a constant resistance value, an appropriate divider node is selected and a partial voltage is tapped. As each divider node is assigned a predefined value of a first variable, from a comparison of the value, assigned to the selected divider node, of the first variable with a field strength value assigned to the value of the first variable in a value table, the field strength value received by the receiver unit can be determined.

According to a second embodiment of the invention, a circuit arrangement for carrying out the method is provided, having a receiver unit for receiving an electromagnetic signal, which comprises an input resistance realized as a voltage divider circuit and an operational amplifier with a fixed amplification factor, whereby the input of the operational amplifier is connected to the voltage divider circuit and the operational amplifier supplies an output voltage from a present input voltage. Further, the receiver unit comprises a control element, connected to the output of the operational amplifier, with an input for the output voltage and an input for a reference voltage. The voltage divider circuit has a constant resistance value and comprises a plurality of divider nodes in series to one another. Further, the control element is set up, to change the input voltage, depending on a comparison of the output voltage with the reference voltage, to provide a control signal for selecting the divider node, and is set up to determine the received field strength, to provide a signal assigned to the control signal at an output, whereby the value of the signal (RS) depends on the received field strength.

An advantage of the method or the circuit arrangement is that the field strength of the received electromagnetic signal can be determined, preferably without further calculations, in a simple manner from a comparison of the selected divider node and stored field strength values, assigned beforehand to the particular divider node. As a result, the method can be used for determining the spatial distance, i.e., the distance between the receiver unit and a transmitting unit, by linking the field strength values, assigned in the value table to the respective divider nodes, to a distance value. Further, by means of the values, determined in such a way, for the field strength or the distance, the data rate can be changed, for example, increased with the decline in the distance and vice versa. Further, because of the low power consumption, the method is especially suitable for obtaining field strength information in the case of passive transponders. The method of the invention is based, inter alia, on the fact that the field strength is linked to the distance between a receiver station and a transmitter station by a nonlinear functional relation. The nonlinear relation can be compensated substantially inversely proportional by the suitable realization of different resistance values of components connected between the particular divider nodes of the voltage divider circuit. In this case, the data of the connected components are accordingly determined beforehand, in order to reproduce the described functional relation between field strength and distance, so that a line as straight as possible results in a preferably linear plot of the divider node number versus the logarithm of the distance between the receiver and the base station. Because the amplification of the operational amplifier remains constant, the output voltage of the operational amplifier has a fixed ratio to the input voltage. As a result, neither at low input voltages nor at high input voltages is the amplification increased and the ratio of the signal voltage to the noise voltage remains low over the entire amplification range. Another important advantage is that over the entire detectable distance range there is an almost uniform spatial resolution both at small distances to the transmitting station and at great distances to the transmitting station.

Another advantage is that the value of the input resistance of the voltage divider circuit does not change with the change in the input voltage. The voltage divider circuit functions comparably to a potentiometer with a center tap. It is understood that the input resistance of the operational amplifier is very high, so that the current, flowing from a selected node connected to the operational amplifier, is negligibly small. Overall, a change in the load at an antenna circuit, connected upstream of the receiver circuit, is avoided. In particular, during use in a transponder, the input voltage source, therefore the antenna circuit, is constantly loaded and the quality of the antenna circuit in particular is not changed. This is an important advantage in an inductively coupled antenna circuit. Tests by the applicant have shown that the voltage divider circuit, i.e., the input resistance, can be made very high-impedance. This is advantageous specifically in circuits operating passively, i.e., those that draw the needed power exclusively from the electromagnetic field of a transmitting station, in order to increase the communication range between a receiver and a transponder operating according to the method of the invention.

Further, particularly with varying signal levels, a rapid turn-on and turn-off transient behavior at the output of the operational amplifier is achieved, because the output voltage and the input voltage of the operational amplifier fluctuate only to a minor extent and the capacitances, present at the input or output of the operational amplifier, are not recharged and the power consumption of the circuit unit declines. In particular, in the case of pulse-pause modulated signals, the field gaps can be reduced by the short turn-on and turn-off transient behavior and the data rate increased. Another advantage of the fixed amplification factor is that in the case of the operational amplifier, the amplification can be adjusted precisely with a low current consumption by means of a high-impedance negative feedback.

An embodiment provides that the partial voltage is tapped by a controllable switching assigned to the divider node. MOS transistors are particularly suitable as the switch. Tests by the applicant have shown that the switch are controlled by an output signal of a counter component, whereby a signal, assigned to the received field strength, is provided at another output of the counter. In this case, the counter can have a number of components corresponding to the number of nodes or switches.

In another embodiment, the voltage divider circuit can be a series connection of a plurality of components. The voltage divider circuit can be formed from a series connection of MOS transistors, preferably NMOS transistors, or passive resistors. In the embodiment as MOS transistors, the control inputs, i.e., the gates of the transistors, are interconnected overall. It is provided to adjust the gate voltage of the transistors in such a way that for the entire voltage range of UIN the operating point of the MOS transistors lies within the linear range of the output characteristic field and, as a result, a behavior comparable to an ohmic resistor is present.

As, to connect the input of the operational amplifier to the node to be selected according to the received field strength, the voltage divider circuit and the associated switch in each case have only small capacitances and require only a very low current, great fluctuations as well in the received field strength can be detected rapidly and reliably by the method of the invention and the associated circuit arrangement and the distance can also be determined rapidly and reliably in the case of moving objects. Stated differently, the circuit arrangement, particularly because of the low capacitances, has a high switching frequency; i.e., changes in the received field strength are corrected rapidly and reliably by means of the control element and finally the received field strength is determined.

According to another embodiment, it is advantageous that in each case two resistance values, compared with one another, between two divider nodes form a logarithmic relationship. As the value of the field strength in zero approximation is inversely logarithmic from the distance of the base station to the transponder, a substantially linear dependence between the number of the node and the distance can be achieved from the number of the node, directly by means of an assignment of the node number to an assigned distance value, preferably stored in a value table. In this case, it is advantageous, when the value of the signal, present at the output of the counter or of the control element, preferably indicates the number of the selected divider node. As a result, a sufficient accuracy or resolution in the distance determination can be established both at small and larger distances between the base station and the transponder. Further, the distance between base station and transponder can be determined without additional calculations by means of the values stored in the value table, also independent of the selected relationship of two resistance values. In summary, the method for determining the field strength can be easily refined into a method for determining the distance between the base station and transponder.

In another embodiment, nonlinear dependences between the node numbers and the distance or a linear dependence between the node number and the field strength can be established by selection of other functional relationships between two resistance values of the voltage divider circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
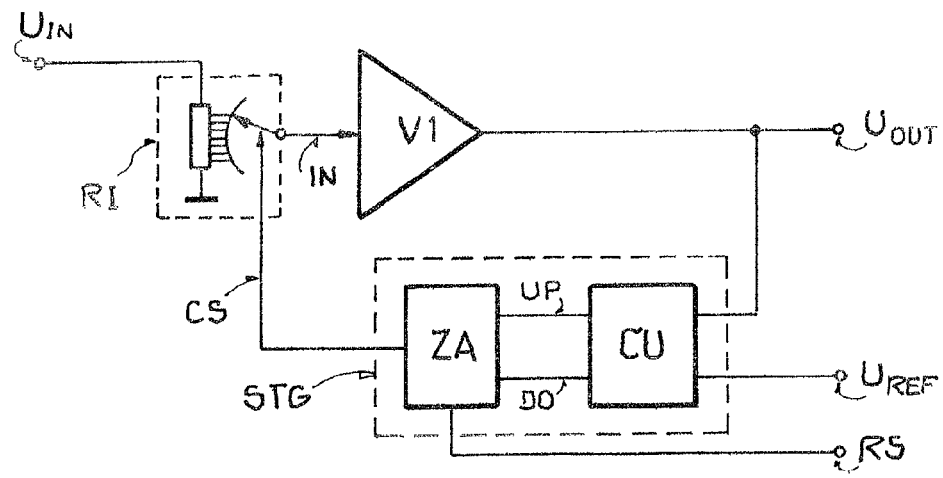
FIG. 1 shows an amplifier circuit with a voltage divider which provides a variable input voltage for an operational amplifier via a control element.

The task of the circuit arrangement, shown in FIG. 1, is to generate an input signal UIN, which has an alternating voltage form and is proportional to the field strength of an electromagnetic signal received by a receive antenna (not shown), from an input voltage IN by means of a voltage divider circuit and to amplify an operational amplifier V1 by a fixed factor, in order to hold the output signal UOUT within a predefined interval by means of a control element STG, which selects a suitable node and hereby does not change the resistance value of an input resistance RI, realized as a voltage divider. The input signal UIN declines completely across the input resistance RI.

The voltage divider circuit with a plurality of nodes has a first terminal, which is linked to the input signal UIN, a second terminal, which is linked to the reference potential, a third terminal, which is formed as a control input and is linked to the control element STG and at which a control signal CS is present, and a fourth terminal, which is linked to an input of the operational amplifier V1. Further, the control element STG has an input, which is linked to the output voltage UOUT, and an input at which a reference voltage UREF is present, and an output for outputting a signal RS. The control element STG has a control unit CU and a counter ZA. The control unit CU, at which the output voltage UOUT and the reference voltage UREF are present, is linked via a control line UP and a control line DO to a counter VA, which has a plurality of components (not shown).

The principle of operation will be described in greater detail below. The operational amplifier V1 is supplied with the input voltage IN from the input signal UIN by means of the voltage divider circuit, by linking one of the nodes of the voltage divider circuit to the operational amplifier V1. In the case of the voltage divider circuit, a node in the vicinity of the reference potential is selected by the control element STG at high present input voltages by means of the control input and of the control signal CS, in order to lower the input voltage IN of the operational amplifier V1 until the output voltage UOUT corresponds to a reference voltage likewise present at the input of the control element STG and lies in particular within an interval spanning the reference voltage UREF. If the output voltage UOUT is below the voltage interval, a node, which is more distant from the reference potential, is selected by the control element STG and as a result of this the input voltage IN of the operational amplifier V1 is increased. The associated field strength value or the distance can be determined from the specifically output signal RS by reading out the quantity assigned in a memory, preferably an assigned field strength value, or most preferably an assigned distance value. Tests by the applicant have shown that the field strength value or the distance value can also be determined without the formation of a memory area with values, assigned to selected nodes, by an algorithm, preferably with use of a processor.

Figure 2:
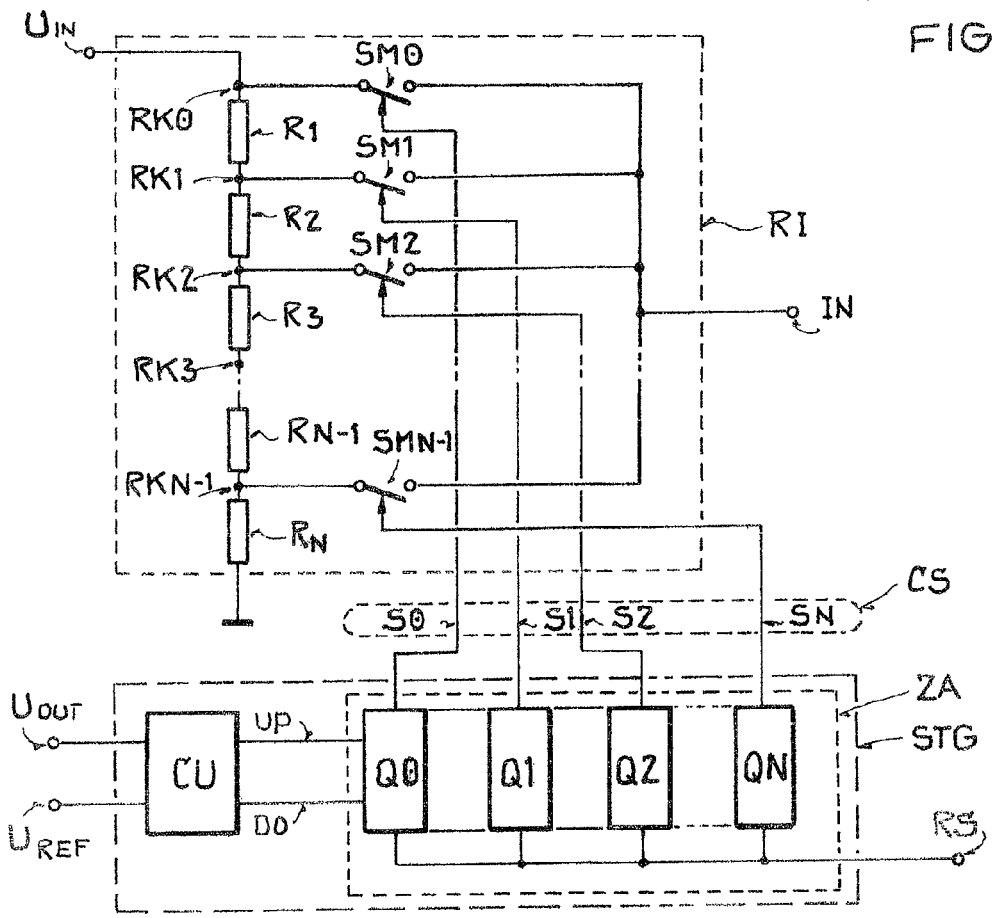
FIG. 2 shows a voltage divider circuit by means of a series connection of resistors and a control circuit.

An exemplary embodiment of the input resistance RI realized as a voltage divider circuit is shown in FIG. 2. A series connection of individual resistors R1, R2, R3, to Rn-1, RN is formed between the first terminal of the voltage divider circuit, at which the input voltage UIN is present, and the reference potential. A node RK0 is formed between the signal UIN and resistor R1, a node RK1 between resistor R1 and resistor R2, a node RK2 between resistor R2 and resistor R3, a node RK3 after the resistor R3, and a node RKN-1 between resistor RN-1 and resistor RN.

The node RK0 can be linked by the controllable switch SM0 to the input of the operational amplifier V1. To this end, the control input of the switch is linked to a component Q0 of the counter ZA and a signal S0 is provided by the component Q0. The node RK1 can be linked by means of the controllable switch SM1 to the input of the operational amplifier V1. To this end, the control input of the switch SM1 is linked to a component Q1 of the counter ZA and a signal S1 is provided by the component Q1. The node RK2 can be linked by means of the controllable switch SM2 to the input of the operational amplifier V1. To this end, the control input of the switch SM2 is linked to a component Q2 of the counter ZA and a signal S2 is provided by the component Q2. The node RKN-1 can be linked by means of the controllable switch SMN-1 to the input of the operational amplifier V1. To this end, the control input of the switch SMN-1 is linked to a component QN of the counter ZA and a signal SN is provided by the component QN.

If the output voltage UOUT is below the reference voltage UREF, a node above of the node selected thus far, i.e., a node that is closer to the input voltage UIN, is chosen by means of the control line DO by the control unit CU, in that, for example, the component Q2 is deactivated by the control line DO and no corresponding signal S2 to close the switch SM2 is provided for the switch SM2 and the switch SM2 consequently breaks the connection of the node RK2 with the input of the operational amplifier V1. The component Q1 is controlled by the control unit CU by means of the control line DO and, as a result, the node RK1 is linked to the input of the operational amplifier V1 by means of the signal S1 and the switch SM1. It is assumed that the output voltage UOUT now lies within a predefined interval and the control process is ended hereby. As the node RK1 is selected by the control unit CU by means of the control line, a corresponding signal RS with a lower value is output by the control unit STG. A correspondingly assigned field strength value or an assigned distance value, which corresponds to the present input signal, can be read preferably out of a memory unit by means of the signal RS, and the distance between the transmitting unit and the receiver unit determined. After this, the value can be output and/or used for control of communication parameters between the transmitter and receiver unit.

As the values of the individual resistors linked in series are suitably selected, the increment of the voltage changes between the individual nodes can be established in such a way that there is a sufficient spatial resolution over the entire measurable range in the particular field strength range or distance range.

Figure 3:
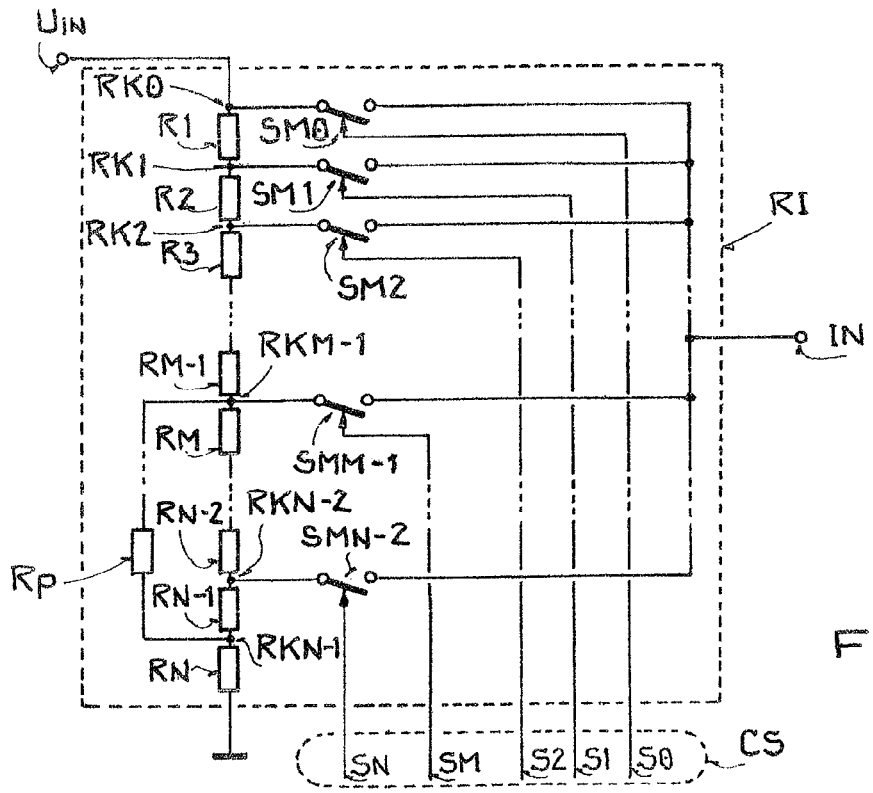
FIG. 3 shows a voltage divider circuit by a series connection and a combination of a series and parallel connection of resistors.

Another exemplary embodiment of an input resistance RI realized as a voltage divider circuit is shown in FIG. 3. The differences to the embodiment explained in relation to the drawing documents of FIG. 2 are set forth below. A node RKM-1 is formed between resistor RM-1 and resistor RM. The node RKM-1 can be linked by means of the controllable switch SMM-1 to the input of the operational amplifier V1. To this end, the control input of the switch SMN-1 is linked to a component QM (not shown) of the counter ZA and a signal SM is provided by the component QM. A resistor RP is connected between the node RKM-1 and the node RKN-1. The gradation of the resistance values and thereby the voltage steps can be influenced advantageously by means of the parallel connection of the resistor RP. Particularly during tapping of the voltage at a node which is connected parallel by the resistor RP, the resistance is reduced by the parallel connection.

Figure 4:
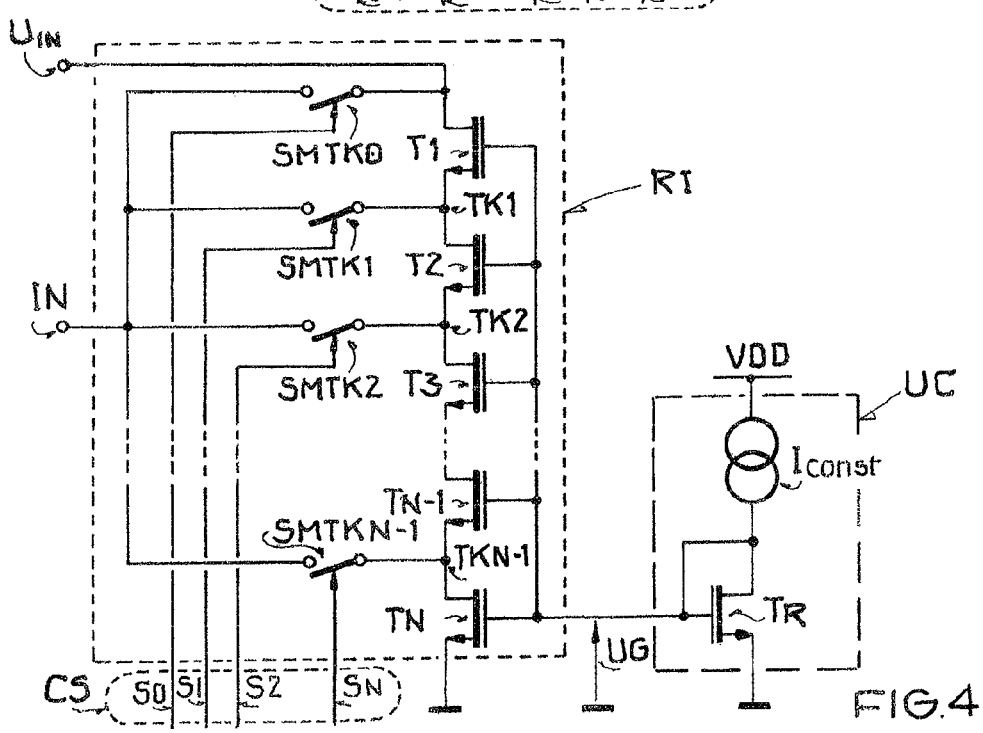
FIG. 4 shows a voltage divider circuit by a series connection of MOS transistors.

Another embodiment of the voltage divider as a series connection of NMOS transistors is shown in FIG. 4. Each of the transistors has an output, an input, and a control input. The control inputs of the transistors are interconnected. According to the present embodiment, the present input voltage UIN can be supplied to the input of the operational amplifier by the first switch SMTK0. To this end, the switch SMTK0 is controlled by means of the signal S0 from the component Q0. Over the further course, a transistor T1 is linked to a transistor T2 with the formation of a node TK1. The node TK1 is connected by means of a controllable switch SMTK1 to the operational amplifier V1 (not shown) in order to supply the input voltage IN to the operational amplifier V1. The switch SMTK1 has a control input, which is connected to the counter component Q1 (not shown) and the signal S1 is present. Transistor T2 is linked to a transistor T3 with the formation of a node TK2. The node TK2 is connected by means of a controllable switch SMTK2 to the operational amplifier V1 (not shown) in order to supply the input voltage IN to the operational amplifier V1. The switch SMTK2 has a control input, which is connected to the counter component Q2 (not shown), and the signal S2 is present. Transistor TN-1 is linked to a transistor TN with the formation of a node TKN-1. The node TKN-1 is connected by means of a controllable switch SMTKN-1 to the operational amplifier V1 (not shown) in order to supply the input voltage IN to the operational amplifier V1. The switch SMTKN-1 has a control input, which is connected to the counter component QN (not shown) and the signal SN is present.

The interconnected control inputs of transistors T1, T2, T3, . . . TN-1, TN are linked to a constant voltage source UC. The constant voltage source UC provides a control voltage UG and is linked to a supply voltage VDD and to a reference potential, preferably a ground potential. To generate the control voltage UG, the constant voltage source UC has a constant current source Iconst, which is connected in series to a transistor TR connected as a diode. The constant control voltage UG is generated by means of the constant current through the transistor diode.

Tests by the applicant have shown that the control voltage UG of the transistors is selected preferably in such a way that for the entire voltage range of UIN the operating point of the MOS transistors lies within the linear range of the output characteristic field and, as a result, a behavior comparable to an ohmic resistor is present. The node whose node voltage must be supplied as the input voltage IN to the operational amplifier V1 is selected by control of the particular switch, so that the output voltage UOUT of the operational amplifier V1 lies at least within the required range around the reference voltage UREF. If this condition is not met, a node that meets the stated conditions is selected by the control element STG.

Figure 5:
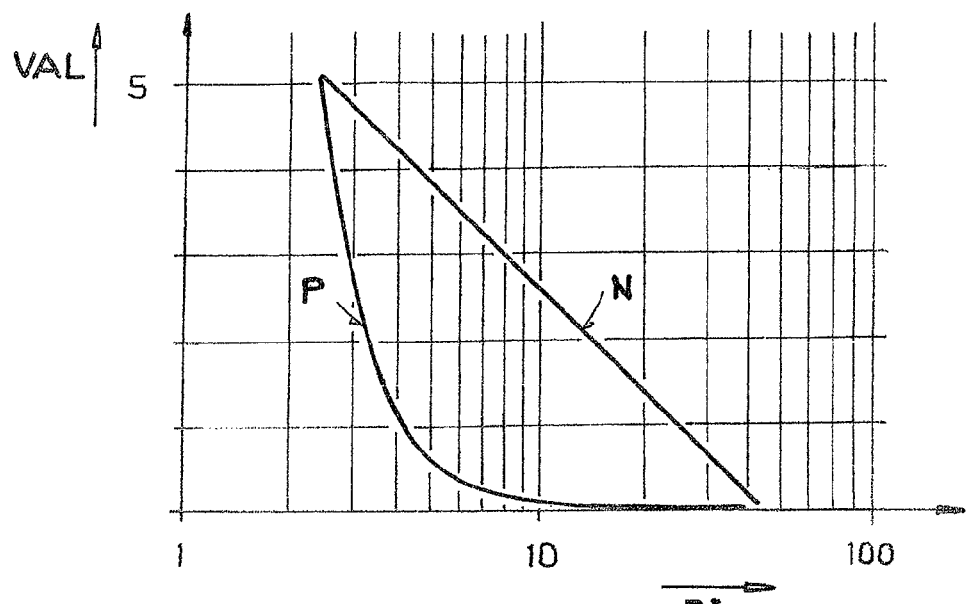
FIG. 5 shows a schematic comparison of the spatial resolution according to the method of the invention and the state of the art.

In FIG. 5, in a linear diagram, the distance of two control points VAL according to the present invention is plotted along the Y-axis versus the logarithm of the distance DI between a transmitting station and a base station along the X-axis; in this case, the values on both axes are selected purely arbitrarily. The relation between the distance of two divider node voltage values and the distance and hereby the spatial resolution according to the present invention is illustrated by means of a line N, whereas the course of the spatial resolution according to the state of the art, for example, known from the patent publication EP 1 318 623 B1, is shown by means of a curve P. In contrast to the prior art, according to the present invention, the determination of the distance at greater distances as well becomes possible reliably and with a much improved concentration of values. The latter is possible only very inaccurately in the prior art.

In the exemplary embodiments provided thus far, the depicted NMOS transistors can also be replaced by PMOS transistors or by bipolar transistors. The control circuit of the control inputs is to be adjusted accordingly hereto. Inter alia, in an embodiment with bipolar transistors, an increased current uptake and the associated reduction of communication range, particularly in passive transponders, are a disadvantage.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for obtaining field strength information from a received electromagnetic signal via a receiver unit, the method comprising:
   generating an input voltage for an operational amplifier from the received signal in the receiver unit via an input resistance configured as a voltage divider circuit;
   generating an output voltage by the operational amplifier via a fixed amplification factor;
   changing the input voltage until the output voltage is within a predefined interval that includes a value of a reference voltage;
   tapping the input voltage at the voltage divider circuit;
   selecting a divider node and tapping a partial voltage to change the input voltage at the voltage divider circuit, which has a plurality of divider nodes and a constant resistance value;
   assigning each divider node a predefined value of a first variable; and
   determining the field strength value received by the receiver unit based on a comparison of the predefined value assigned to the selected divider node of the first variable with a field strength value assigned to a value of a first variable in a value table.

2. The method according to claim 1, wherein the partial voltage is tapped via a switch assigned to one of the divider nodes.

3. The method according to claim 2, wherein the switch is controlled by an output signal of a component of a counter.

4. The method according to claim 3, wherein a signal, assigned to the received field strength, is provided at an output of the counter.

5. The method according to claim 1, wherein the voltage divider circuit is a series connection of a plurality of components.

6. The method according to claim 1, wherein the voltage divider circuit is formed from a series connection of MOS transistors.

7. A circuit arrangement comprising a receiver unit for receiving an electromagnetic signal, the receiver unit comprising:
   an input resistance configured as a voltage divider circuit;
   an operational amplifier having a fixed amplification factor, an input thereof being connected to the voltage divider circuit, the operational amplifier configured to supply an output voltage from a present input voltage; and
   a control element connectable to the output of the operational amplifier, the control element having an input for the output voltage and an input for a reference voltage, wherein the voltage divider circuit has a constant resistance value and comprises a plurality of divider nodes in series to one another, wherein the control element is configured to change the input voltage based on a comparison of the output voltage with the reference voltage to provide a control signal for selecting the divider nodes, and wherein the receiver unit is configured to determine a received field strength, and to provide a signal assigned to a control signal, a value of the signal being based on the received field strength.

8. The circuit arrangement according to claim 7, wherein the voltage divider circuit has controllable switches assigned to the divider node.

9. The circuit arrangement according to claim 7, wherein the control element comprises a counter with at least one output for controlling the switches via an output signal.

10. The circuit arrangement according to claim 7, wherein the voltage divider circuit comprises a series connection of a plurality of components.

11. The circuit arrangement according to claim 7, wherein the voltage divider circuit comprises a series connection with a plurality of MOS transistors, and wherein the control inputs of the MOS transistors are interconnected.

12. The circuit arrangement according to claim 7, wherein resistance values of the voltage values between two divider nodes form a logarithmic relationship.

13. The circuit arrangement according to claim 7, wherein the value of the signal indicates the number of the selected divider node.

* * * * *